(12) United States Patent
Roelkens (10) Patent No.: US 10,847,673 B2
(45) Date of Patent: Nov. 24, 2020

(54) COUPLING A SEMICONDUCTOR COMPONENT TO A TARGET SUBSTRATE BY TRANSFER PRINTING

(71) Applicants: IMEC VZW, Leuven (BE); Universiteit Gent, Ghent (BE)

(72) Inventor: Gunther Roelkens, Schellebelle (BE)

(73) Assignees: IMEC VZW, Leuven (BE); UNIVERSITEIT GENT, Ghent (BE)

(*) Notice: Subject to any disclaimer, the term of this patent is extended or adjusted under 35 U.S.C. 154(b) by 0 days.

(21) Appl. No.: 16/371,754

(22) Filed: Apr. 1, 2019

(65) Prior Publication Data

US 2019/0305179 A1    Oct. 3, 2019

(30) Foreign Application Priority Data

Apr. 3, 2018 (EP) .................................. 18165502

(51) Int. Cl.
*H01L 23/544* (2006.01)
*H01L 21/683* (2006.01)
(Continued)

(52) U.S. Cl.
CPC ...... *H01L 33/0095* (2013.01); *H01L 21/6835* (2013.01); *H01L 23/544* (2013.01); *H01L 33/0093* (2020.05); *H01L 33/30* (2013.01); *H01L 33/48* (2013.01); *H01L 2221/6835* (2013.01); *H01L 2221/68322* (2013.01); (Continued)

(58) Field of Classification Search
None
See application file for complete search history.

(56) References Cited

U.S. PATENT DOCUMENTS 5,492,223 A  *  2/1996  Boardman ........ H01L 21/67333
                                                          206/710
7,195,733 B2     3/2007  Rogers et al.
(Continued)

FOREIGN PATENT DOCUMENTS

WO    WO2017/169485 A1    10/2017

OTHER PUBLICATIONS

Groote, Andreas De, et al. "Transfer-Printing-Based Integration of Single-Mode Waveguide-Coupled III-V-on-Silicon Broadband Light Emitters." Optics Express, vol. 24, No. 13, 2016, p. 13754., doi:10.1364/oe.24.013754. (Year: 2016).*

(Continued)

*Primary Examiner* — J. E. Schoenholtz
(74) *Attorney, Agent, or Firm* — McDonnell Boehnen Hulbert & Berghoff LLP (57) ABSTRACT

The disclosure is related to a method for producing at least one semiconductor component coupled to a target substrate, where a coupon comprising one or more constituent layers of the at least one semiconductor component is transferred to the target substrate by transfer printing. The coupon is embedded in a portion of a support layer thereby forming an enlarged coupon provided with solid alignment markers on the underside thereof. Corresponding hollow alignment markers exist on the location of the target substrate where the coupon is to be placed. The alignment markers engage to thereby align the coupon to the target location. The disclosure is equally related to a device assembly obtainable by the method.

11 Claims, 5 Drawing Sheets

(51) Int. Cl.
    *H01L 33/00*    (2010.01)
    *H01L 33/30*    (2010.01)
    *H01L 33/48*    (2010.01)
(52) U.S. Cl.
    CPC ............... *H01L 2221/68354* (2013.01); *H01L 2221/68368* (2013.01); *H01L 2223/54426* (2013.01); *H01L 2223/54486* (2013.01)

(56) References Cited

U.S. PATENT DOCUMENTS

| | | | | |
|---|---|---|---|---|
| 7,373,052 | B2* | 5/2008 | Nadeau | G02B 6/423 |
| | | | | 385/39 |
| 8,373,259 | B2* | 2/2013 | Kim | G02B 6/3882 |
| | | | | 257/678 |
| 9,076,907 | B2 | 7/2015 | Englund et al. | |
| 9,576,595 | B1 | 2/2017 | Hipwell, Jr. et al. | |
| 2004/0142575 | A1 | 7/2004 | Brewer | |
| 2006/0115323 | A1* | 6/2006 | Coppeta | A61K 9/0097 |
| | | | | 403/270 |
| 2011/0170266 | A1* | 7/2011 | Haensch | H01L 25/50 |
| | | | | 361/722 |
| 2013/0181339 | A1* | 7/2013 | Fan | H01L 21/50 |
| | | | | 257/737 |
| 2016/0005700 | A1 | 1/2016 | Rogers et al. | |
| 2017/0170127 | A1 | 6/2017 | Choi et al. | |
| 2018/0197802 | A1 | 7/2018 | Nagamatsu et al. | |
| 2019/0378781 | A1* | 12/2019 | Hedrick | H01L 21/8221 |

OTHER PUBLICATIONS

Brian Corbett, et. al, "Transfer print techniques for heterogeneous integration of photonic components,Progress in Quantum Electronics", vol. 52, (2017), pp. 1-17, https://doi.org/10.1016/j.pquantelec.2017.01.001. (Year: 2017).*

Bowers, C., et. al., "Heterogeneous Integration of Microscale Semiconductor Devices by Micro-Transfer-Printing", Electronic Components and Technology Conference, San Diego CA May 26-29, 2015. (Year: 2015).*

European Search Report, European Patent Application No. EP 18165502.8, dated Sep. 13, 2018, 9 pages.

De Groote, Andreas, et al., "Transfer-Printing-Based Integration of Single-Mode Waveguide-Coupled III-V-On-Silicon Broadband Light Emitters," Optics Express, vol. 24, No. 13, Jun. 27, 2016, pp. 13754-13762.

* cited by examiner

COUPLING A SEMICONDUCTOR COMPONENT TO A TARGET SUBSTRATE BY TRANSFER PRINTING

CROSS-REFERENCE TO RELATED APPLICATIONS

The present application is a non-provisional patent application claiming priority to European Patent Application No. 18165502.8, filed Apr. 3, 2018, the contents of which are hereby incorporated by reference.

FIELD OF THE DISCLOSURE

The present disclosure is related to a technique of transfer printing used for the coupling of semiconductor components to a substrate, which can be useful in the heterogeneous integration of III-V components to a silicon substrate for the fabrication of photonic integrated circuits. The disclosure is however not exclusively related to this field.

BACKGROUND

The document "Transfer-printing-based integration of single-mode waveguide-coupled III-V-on-silicon broadband light emitters", De Groote et al., Optical Society of America, published 13 Jun. 2016, describes the coupling of III-V opto-electronic components to a silicon photonic integrated circuit through transfer printing. Thin InP based membranes are transferred to an SOI (Silicon-on-insulator) waveguide circuit, after which a single-spatial-mode broadband light source is fabricated. The document describes the process flow and the characteristics of the resulting device. A thin-film material stack or device (hereafter referred to as a coupon) is transferred by transfer printing from a source substrate to a target substrate. The coupons are prepared such that they can be picked up by a soft elastomeric stamp such as a polydimethylsiloxane (PDMS) stamp. While showing similarities with a pick-and-place technique, a potential advantage of the transfer printing approach is that coupons can be transfer-printed in a parallel way, by picking up and putting down large arrays of coupons at the same time. This allows for a high-throughput integration process.

Transfer printing is therefore considered to be an enabling heterogeneous integration technology. Nevertheless, the alignment of the coupons relative to the target substrate is in some cases insufficient. This is particularly the case when multiple coupons of a large array of coupons are transferred simultaneously. Current state-of-the-art tools have a 1.5 μm 3σ alignment accuracy for an array of about five square centimeters in overall size of the array itself, with the coupons having in-plane dimensions on the order of about 10 μm to a few hundred micrometers. For the case of photonic components, this is often less than desirable.

SUMMARY

The disclosure aims to alleviate the above-described misalignment issues and to improve the alignment accuracy of transfer printing based methods. The disclosure is related to a method and a device as described in the appended claims. The disclosure is related to a method for producing a semiconductor component coupled to a target substrate, wherein a coupon comprising one or more constituent layers of the component is transferred to the target substrate by transfer printing. The coupon is embedded in a portion of a support layer, and an enlarged coupon is formed, the enlarged coupon being provided with solid alignment markers on an underside thereof. Corresponding hollow alignment markers are formed at a surface of target substrate at a location where the coupon is to be placed. When transferring the coupon by transfer printing, i.e., using a stamp made of a flexible material for picking up and placing the coupons, the solid alignment markers of the enlarged coupon engage with the hollow alignment markers of the target substrate, thereby establishing improved alignment of the coupon to the target location on the target substrate. The disclosure is also related to a device assembly obtainable by the method.

The disclosure is related to a method for coupling at least one semiconductor component to a target substrate, the method comprising the steps of: providing on a surface of a source substrate a release layer; providing on the release layer a functional layer consisting of or comprising one or more constituent layers of the at least one semiconductor component; patterning the release layer and the functional layer to form on the surface of the source substrate at least one island from the release layer with a coupon formed from the functional layer on the at least one island, the at least one island extending outward laterally from at least one side of the circumference of the coupon formed thereon, wherein the coupon consists of or comprises the at least one semiconductor component or at least one intermediate component that is to be further processed for producing the at least one semiconductor component; forming one or more hollow alignment markers at an exposed surface of the at least one island in one or more areas laterally extending outward from the coupon formed thereon; forming a support layer covering the at least one island and the coupon formed thereon, thereby filling the hollow alignment markers and embedding the at least one island and the coupon formed thereon in the support layer; patterning the support layer, thereby forming at least one package on the source substrate, the at least one package comprising the at least one island and the coupon formed thereon, embedded in a portion of the support layer; forming an encapsulating layer on the at least one package and patterning the encapsulating layer, thereby covering an upper surface of the at least one package with the encapsulating layer and forming tethers of the encapsulating layer material, anchoring the at least one package to the source substrate; removing the at least one island, thereby forming at least one enlarged coupon attached only by the tethers to the source substrate, the at least one enlarged coupon consisting of the portion of the support layer with a coupon embedded therein, the at least one enlarged coupon comprising solid alignment markers formed on an underside thereof, the solid alignment markers being formed from the material of the support layer that has previously filled the hollow alignment markers in the release layer; picking up the at least one enlarged coupon by a stamp suitable for transfer printing, the stamp being produced from a flexible material; forming at a surface of a target substrate hollow alignment markers corresponding to the solid alignment markers formed on the underside of the at least one enlarged coupon, enabling engagement of the solid alignment markers with the hollow alignment markers on the target substrate; performing an initial alignment, thereby aligning the at least one enlarged coupon to a corresponding predetermined location on the target substrate; by performing the initial alignment, the one or more enlarged coupons, and thus one or more coupons, are aligned at a distance from the target substrate at which there is no contact between the solid alignment markers on the enlarged coupons and the hollow alignment markers on the target substrate. After this initial alignment step, the solid alignment markers face the hollow alignment markers so that they will engage when the coupons are placed down onto the target substrate; placing the at least one enlarged coupon onto the target substrate, thereby establishing a final alignment by engagement of the solid alignment markers of the at least one enlarged coupon with the hollow alignment markers of the target substrate, up to the point where the coupon of the at least one enlarged coupon becomes attached to the surface of the target substrate, thereby aligning and attaching at least one coupon to the target substrate; and releasing the stamp and removing the encapsulation layer and the portion of the support layer, thereby leaving the at least one coupon attached to the target substrate, thereby either obtaining the at least one semiconductor component coupled to the target substrate semiconductor component, or afterwards performing further processing steps on the at least one coupon for producing the at least one semiconductor component.

According to an embodiment, an array of coupons is produced on the source substrate and all the coupons of the array are simultaneously transferred to the target substrate.

According to an embodiment, an array of coupons is produced on the source substrate and selected coupons of the array are simultaneously transferred to the target substrate.

The at least one semiconductor component may for example be a III-V optoelectronic component and the target substrate may for example comprise an optical circuit to which the optoelectronic component is to be coupled.

According to an embodiment, each of the hollow alignment markers produced in the islands of release layer material and in the target substrate has slanted side walls oriented downward from the surface respectively of the islands and of the target substrate and slanted towards each other. The hollow alignment markers may be V-shaped grooves or holes.

According to an embodiment, the material of the support layer is chosen from the group of amorphous silicon, silicon nitride, and silicon oxide.

The disclosure is also related to a semiconductor device assembly comprising a target substrate portion and at least one semiconductor component coupled thereto, wherein the target substrate portion comprises one or more hollow alignment markers placed adjacent to the at least one semiconductor component.

According to an embodiment of the device, each of the hollow alignment markers has slanted side walls oriented downward from the surface of the target substrate portion and slanted towards each other. The hollow alignment markers may be V-shaped grooves or holes.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1A:
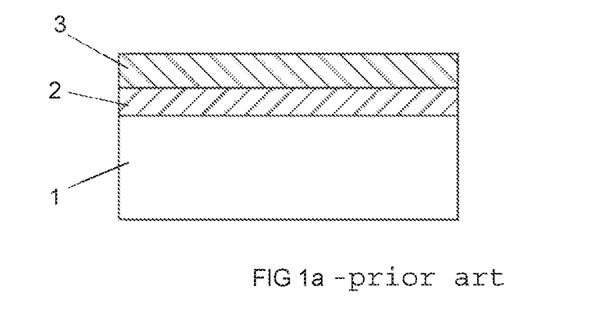
FIG. 1a illustrates a process of transfer printing a III-V coupon onto an SOI substrate, according to an example embodiment.
Figure 1B:
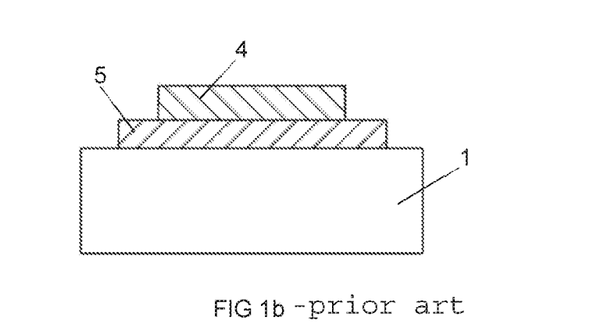
FIG. 1b illustrates a process of transfer printing a III-V coupon onto an SOI substrate, according to an example embodiment.
Figure 1C:
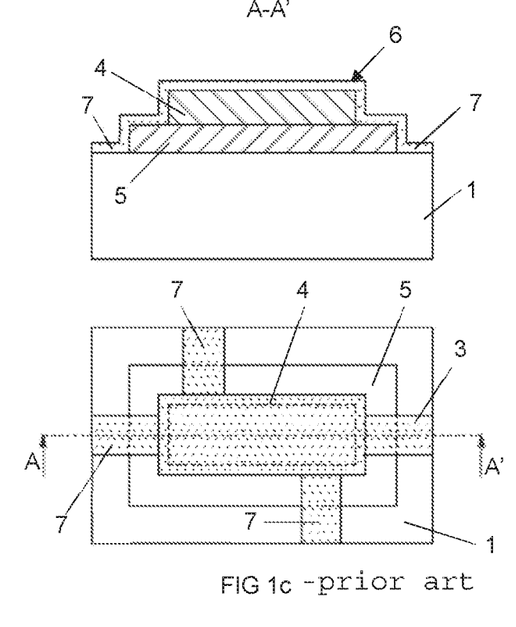
FIG. 1c illustrates a process of transfer printing a III-V coupon onto an SOI substrate, according to an example embodiment.
Figure 1D:
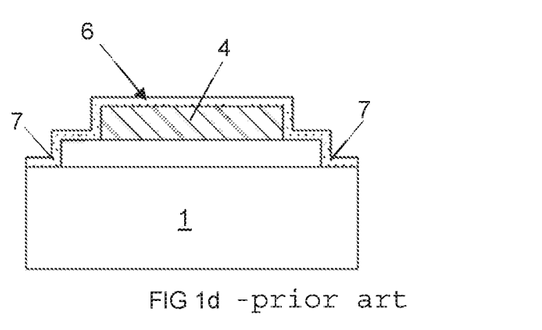
FIG. 1d illustrates a process of transfer printing a III-V coupon onto an SOI substrate, according to an example embodiment.
Figure 1E:
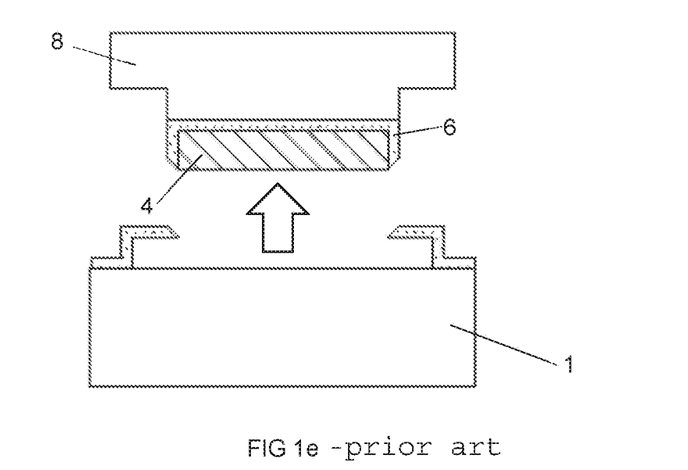
FIG. 1e illustrates a process of transfer printing a III-V coupon onto an SOI substrate, according to an example embodiment.

The steps of a first process for transfer printing an array of III-V coupons are first described. The process is however applicable to an array as well as to a single coupon. Details of the process may be found in the above-cited publication by De Groote et al. As shown in FIG. 1a, a III-V source substrate 1 is provided and a number of layers are produced on the substrate. The first is a release layer 2, followed by a functional layer 3, which is usually a multilayer comprising one or more layers which are to serve as constituent layers of the eventual semiconductor component that is to be produced, for example a stack of III-V layers designed for forming an opto-electronic component such as a light-emitting diode. The functional layer 3 may further comprise one or more sacrificial layers on top of the constituent component layers for increasing the mechanical strength of the coupons which are to be transferred. These coupons 4 are subsequently patterned as portions of the functional layer 3 using lithography and etching, as illustrated in FIG. 1b. The release layer 2 is equally patterned, thereby creating an array of separate islands 5 of the release layer, with III-V coupons 4 on the islands. The array is then covered (FIG. 1c) by a conformal encapsulation layer 6, for example a polymer photoresist. The encapsulation layer 6 is then patterned so that it remains on top of the III-V coupons 4 and in selected areas around the coupons, the areas forming tethers 7 which anchor the coupons 4 to the source substrate 1. The release layer islands 5 are then removed, FIG. 1d, for example by a wet etchant, thereby undercutting the coupons 4 and leaving the coupons 4 attached only by the tethers 7, ready for transfer printing. As illustrated in FIG. 1e, the coupons are picked up by a stamp 8 which is laminated against the coupon array.

Figure 1F:
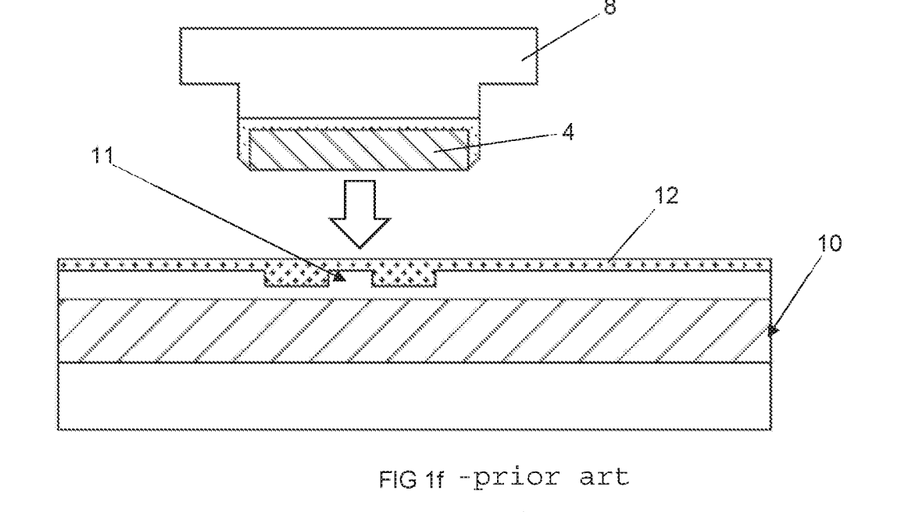
FIG. 1f illustrates a process of transfer printing a III-V coupon onto an SOI substrate, according to an example embodiment.
Figure 1G:
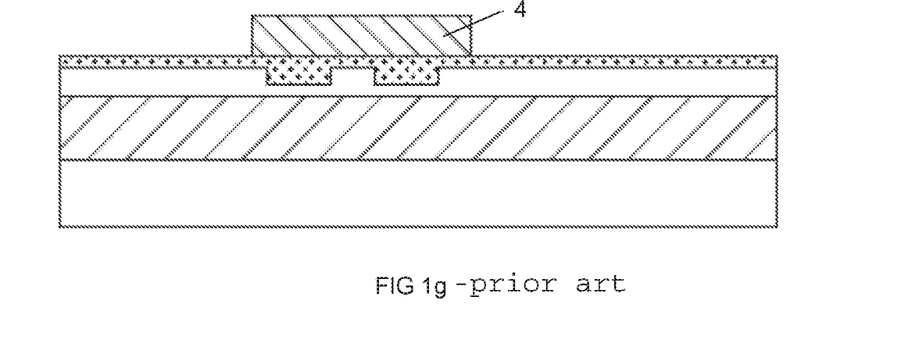
FIG. 1g illustrates a process of transfer printing a III-V coupon onto an SOI substrate, according to an example embodiment.

The stamp 8 may comprise a sheet of a flexible material, for example an elastomeric material such as PDMS, pressed against the full array of coupons, in order to pick up all the coupons of the full array simultaneously, or it may be a patterned stamp, which is formed as a base provided with posts of the flexible material, wherein the posts are positioned to pick up selected coupons of the array. The latter approach allows a so-called area magnification described in more detail in the cited article by De Groote et al., i.e. a process wherein the pitch of the coupons on the source substrate can be much denser than the pitch on the target substrate. When the stamp 8 is retracted, the tethers 7 are broken and the coupon 4 is transferred to a target substrate 10 (FIG. 1f), which may be a silicon-on-insulator (SOI) substrate comprising a photonic waveguide circuit 11 to which the III-V coupon 4 is to be coupled. An adhesive layer 12, for example a divinylsiloxane-bis-benzocyclobutene (DVS-BCB) layer may be spin-coated on the SOI substrate for establishing an adhesive bond between the coupon 4 and the target substrate 10. After removing the encapsulation layer 6 (FIG. 1g), the coupon 4 may then be further processed, for example by removal of the sacrificial strengthening layers and by additional patterning, to form the final III-V opto-electronic device coupled to the SOI.

In the above-described process, the alignment of the coupons 4 to the target substrate 10 is usually realized through visual alignment markers included on the coupons and on the target substrate, and by alignment software. As stated, the accuracy of such alignment techniques is often less than desirable, in particular when large arrays of coupons are transferred. In this case, the visual alignment markers may be aligned for one coupon or for part of the coupons, but errors in the pitch of the array often make it impossible to achieve accurate alignment over the complete area of the array. The planar dimensions of III-V coupons are in the order of micrometers and may be anything between 10 micrometers and a few hundred micrometers. As stated, the currently obtainable minimum alignment error when large arrays of III-V coupons of this size are transfer printed is generally on the order of 1.5 μm (3σ).

Figure 2A:
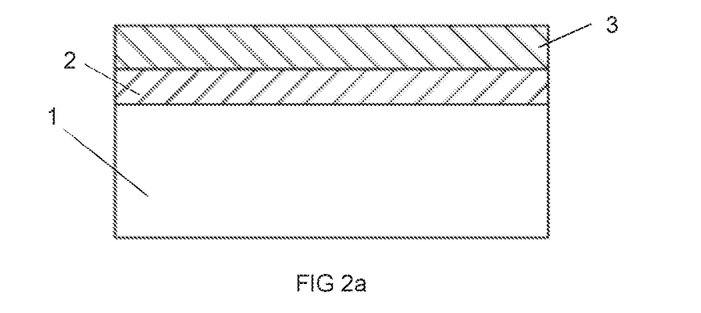
FIG. 2a illustrates a process for transfer-printing a III-V coupon, according to an example embodiment.
Figure 2B:
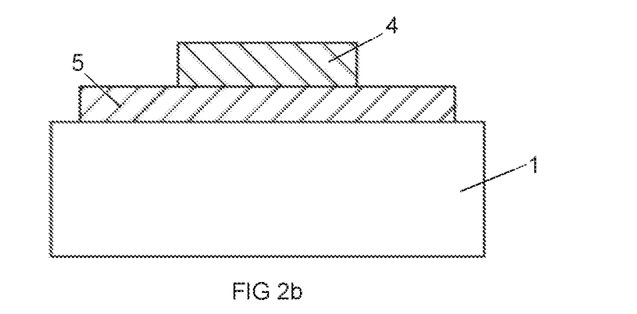
FIG. 2b illustrates a process for transfer-printing a III-V coupon, according to an example embodiment.
Figure 2C:
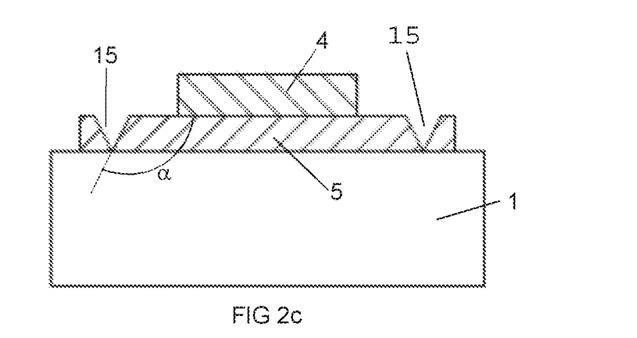
FIG. 2c illustrates a process for transfer-printing a III-V coupon, according to an example embodiment.

Another method of the disclosure can yield improvements in alignment quality, and can allow improvement of alignment accuracy to about 0.5 μm 3σ. The process steps according to an embodiment are illustrated in FIGS. 2a to 2j, for an example wherein an array of III-V coupons is coupled to an SOI target substrate, although the method is applicable to any type of coupon and target substrate, and to an array as well as to a single coupon. FIGS. 2a and 2b show steps similar to those described above: deposition and patterning of a release layer 2 and a functional layer 3 on a III-V source substrate 1, to form on the substrate 1 an array of islands 5 of the release layer material and the III-V coupons 4. In an additional lithography and etch step illustrated in FIG. 2c, hollow alignment markers 15 are formed in each of the release layer islands 5. In each island 5, the hollow alignment markers 15 are produced in one or more areas of the island that extend outward laterally from the circumference of the coupon 4. That is, the hollow alignment markers are formed in one or more areas of the island that are lateral to the area where the coupon 4 is located.

The hollow alignment markers 15 are cavities which are open to the exposed surface (the surface facing away from the source substrate 1) of the release layer islands 5 and which have one or more slanted sidewalls, slanting downward from the exposed surface of the release layer island 5 towards the bottom of the cavity. For example, grooves or holes having a V-shaped cross-section may be produced, as shown in the drawings. One known way of producing such grooves or for forming holes having the shape of an inverted pyramid is to apply an anisotropic etch process wherein the openings etched in the surface progress according to predefined angles defined by the crystallographic planes of the material. This technique is applicable for producing the hollow alignment markers 15 provided that the release layer material is a crystalline material and that the crystallographic structure of the release layer material is suitable for applying the technique. The disclosure is however not limited to a particular technique for producing the hollow alignment markers 15. Any known technique which forms, for example, conical holes or grooves with a trapezium-shaped cross section are also suitable. The hollow alignment markers do not need to have straight slanting walls, nor do they need to be symmetrically shaped relative to a center plane, like the V-grooves. The sidewalls can be slanted downward towards each other, i.e., the angle α (see FIG. 2c) between the surface of the island 5 and the sidewalls at their intersection with the surface is an obtuse (blunt) angle. This is related to the fact that the hollow alignment markers 15 will serve further in the process as molds for the formation of solid alignment markers which can engage in a lock-and-key manner with additional, complementary hollow alignment markers in the target substrate.

The lithography and etch process for defining the array of islands 5 and coupons 4 is designed such that each island 5 extends laterally outward from the circumference of the associated coupon to a sufficient degree to allow the production of the alignment markers 15, taking into account the required dimensions of the hollow alignment markers. In the case of transfer printing of III-V coupons in the above-indicated size range of 10 micrometers to a few hundred micrometers, the transverse dimension of the hollow alignment markers as seen in the plane of the release layer 2, for example, the width of the hollow alignment markers 15 in the plane, is in the order of micrometers, for example, between 1 and 10 The island 5 extends outward laterally from the associated coupon 4 at least at one side of the coupon, e.g., at least at two opposite sides. One embodiment is shown in the drawings, wherein the coupons 4 are centrally placed on the islands 5, leaving an area surrounding the coupons, in which the hollow alignment markers 15 may be produced. In each island 5, at least one hollow alignment marker 15 can be produced. A plurality of hollow alignment markers can be formed in each island, for example, a pair of V-shaped grooves, symmetrically placed at two opposing sides of the coupon 4, as illustrated in the drawings.

Figure 2D:
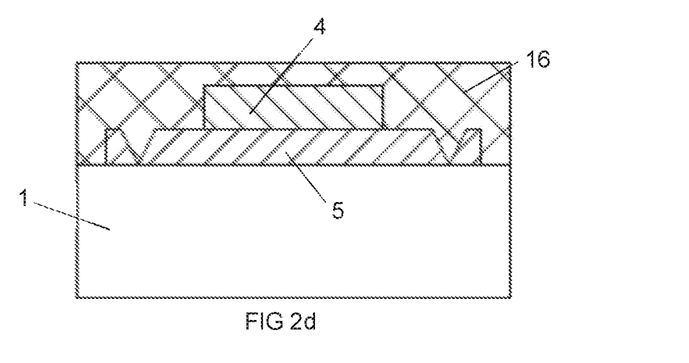
FIG. 2d illustrates a process for transfer-printing a III-V coupon, according to an example embodiment.
Figure 2E:
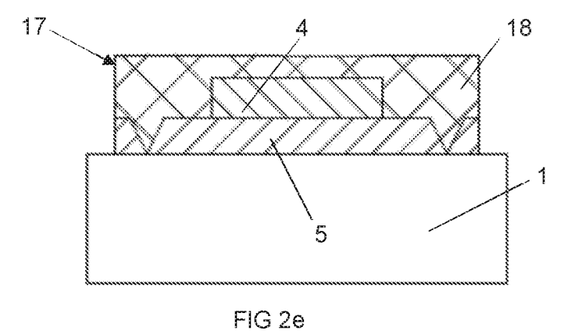
FIG. 2e illustrates a process for transfer-printing a III-V coupon, according to an example embodiment.
Figure 2F:
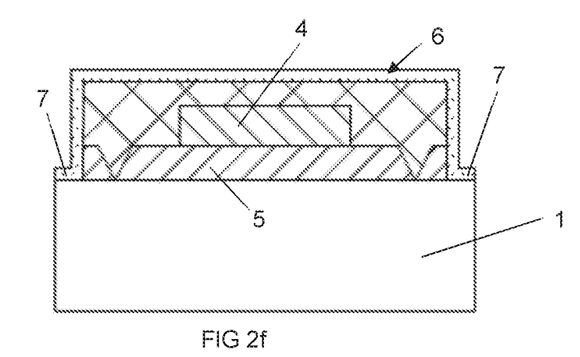
FIG. 2f illustrates a process for transfer-printing a III-V coupon, according to an example embodiment.
Figure 2G:
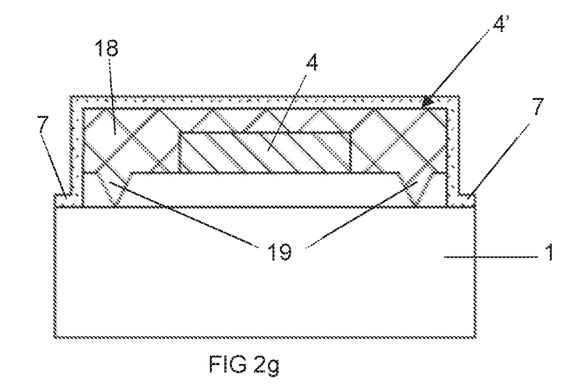
FIG. 2g illustrates a process for transfer-printing a III-V coupon, according to an example embodiment.
Figure 2H:
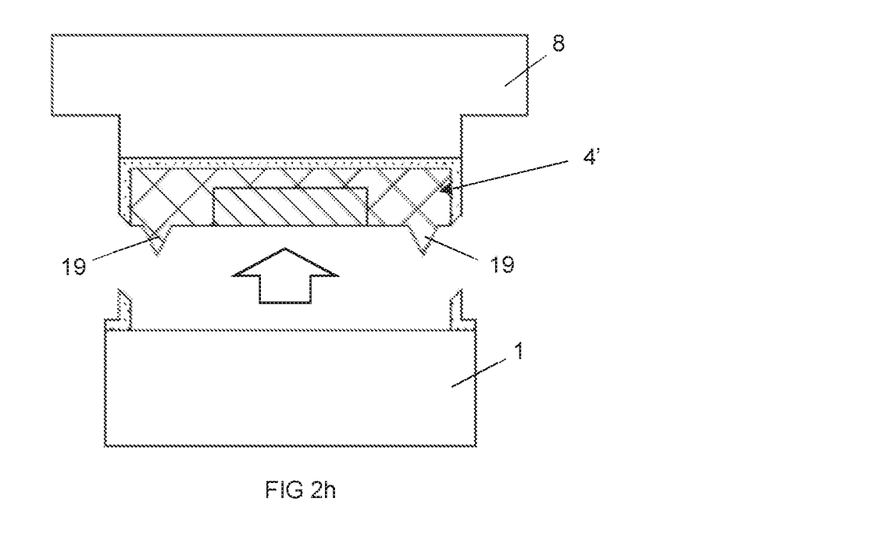
FIG. 2h illustrates a process for transfer-printing a III-V coupon, according to an example embodiment.

On top of the array of islands 5 and coupons 4, with the hollow alignment markers 15 produced in the islands 5, a support layer 16 is deposited (FIG. 2d). This may be an amorphous silicon layer deposited by chemical vapor deposition. The layer fills the hollow alignment markers 15 and covers the coupons 4. The support layer 16 is then patterned (FIG. 2e) so that an array of separate packages 17 is formed on the source substrate 1, each package comprising an island 5 of the release layer, with a coupon 4 on the island, wherein the coupon 4 is embedded in a portion 18 of the support layer material. Following this (FIG. 2f), the packages 17 are encapsulated by an encapsulation layer 6 such as a polymer resist layer, which is subsequently patterned to form tethers 7 by which the packages 17 are anchored to the substrate 1. The release layer islands 5 are removed (FIG. 2g) e.g., by wet etching, leaving enlarged coupons 4' attached only by the tethers 7 to the substrate 1. Each enlarged coupon 4' consists of an original (initial) coupon 4 embedded in the portion 18 of the support layer 16. As seen in FIG. 2h, the enlarged coupon 4' is then picked up by a stamp 8 formed of a flexible material. The package 17 is shown in the drawings as having a flat upper surface following from the flat upper surface of the support layer 16 after its deposition. This does not however suggest that a planarization of this layer is required. The flatness of the upper surface of the package 17 is not a requirement as such, given that the stamp 8 used in transfer printing has a degree of flexibility and thus compressibility as it can be formed of an elastomeric material. When the stamp picks up the package, the tethers 7 are broken. The removal of the release layer material results in the appearance of solid alignment markers 19 on the underside of the enlarged coupon 4'. The solid alignment markers 19 are formed from the material of the support layer 16 that has filled the hollow alignment markers 15 produced in the release layer islands, i.e. the size and shape of the solid alignment markers 19 is essentially the negative of the size and shape of the hollow alignment markers 15, i.e. the solid alignment markers 19 and the hollow alignment markers 15 have a complementary shape of essentially the same size.

Figure 2I:
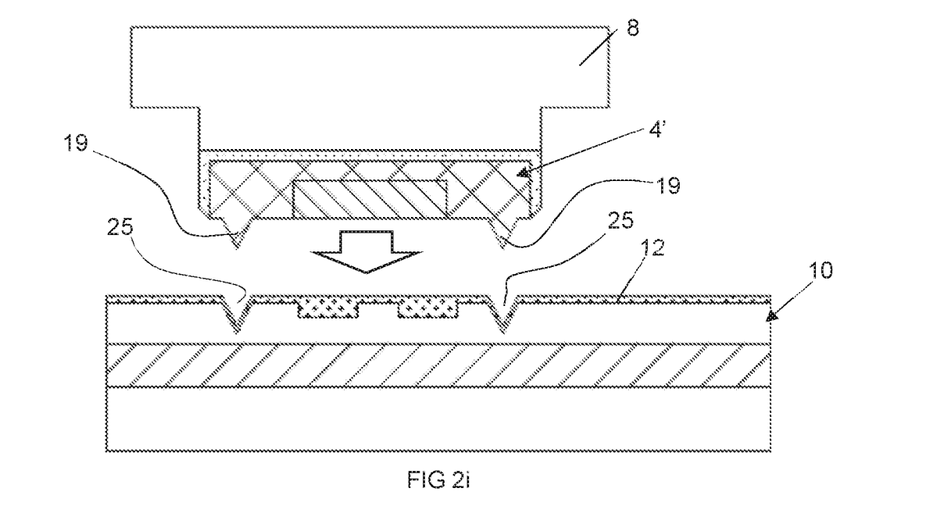
FIG. 2i illustrates a process for transfer-printing a III-V coupon, according to an example embodiment.

As seen in FIG. 2i, hollow alignment markers 25 are formed at the surface of the target substrate 10, which may for example be an SOI substrate provided with a photonic circuit 11 and an adhesive layer 12. The size and shape of the hollow alignment markers 25 corresponds to the size and shape of the solid alignment markers 19 in the sense that the solid alignment markers 19 may engage with the hollow alignment markers 25 such that when the solid and hollow alignment markers are fully engaged in a lock-and-key manner, the underside of the coupon 4 comes into contact with the target substrate 10. To this aim, the hollow alignment markers 25 produced in the target substrate can be slightly larger than the hollow alignment markers 15 originally produced in the release layer 2. The exact size difference is controllable through the control of the respective processes (e.g. lithography, anisotropic etching) applied for producing the hollow alignment markers 15 and 25. The thickness of the adhesion layer 12 depends on the type of adhesion material that is applied. In a number of cases, the thickness is negligible compared to the dimensions of the alignment markers. If this is not the case, the thickness and possibly the compressibility of the adhesion layer 12 needs to be taken into account in the dimensioning of the hollow alignment markers 15 and 25.

The enlarged coupon 4' is aligned to the target substrate 10 and placed onto the substrate by the stamp 8. An initial alignment, i.e. before engagement of the alignment markers, may take place according to any method, such as the inclusion of visual alignment markers and alignment software. At this point, the outer end of the solid alignment markers 19 (e.g. the tip or ridge in the case of V-shaped holes or grooves) is positioned within the footprint of the corresponding hollow alignment markers 25. The enlarged coupon 4' is then placed onto the target substrate such that it comes into physical contact with the adhesion layer 12. The solid alignment markers 19 on the enlarged coupon 4' engage with the hollow alignment markers 25 in the target substrate 10, thereby obtaining a final alignment. The final alignment is established by the engagement of the solid alignment markers 19 with the hollow alignment markers 25, the engagement guiding and forcing the enlarged coupon 4' into a predetermined position defined by the respective alignment markers, resulting in a self-aligning effect (final alignment). Any misalignment remaining after the initial alignment between the alignment markers 19 and 25 is compensated by the fact that the coupon is attached to a stamp that has a degree of flexibility due to the material of the stamp, e.g. an elastomeric material such as PDMS. This gives the coupon a degree of lateral freedom of movement, enabling full engagement of the respective alignment markers, at which point the original coupon 4 becomes attached to the target substrate. The angle of the slanted sidewalls of the solid alignment markers 19 and the hollow alignment markers 25 is chosen so as to ensure that the tip or ridge of the solid alignment markers 19 may be placed within the footprint of the hollow alignment markers 25 by the initial alignment, and so as to enable the full engagement by sliding of the solid alignment markers 19 into the fully engaged position.

Figure 2J:
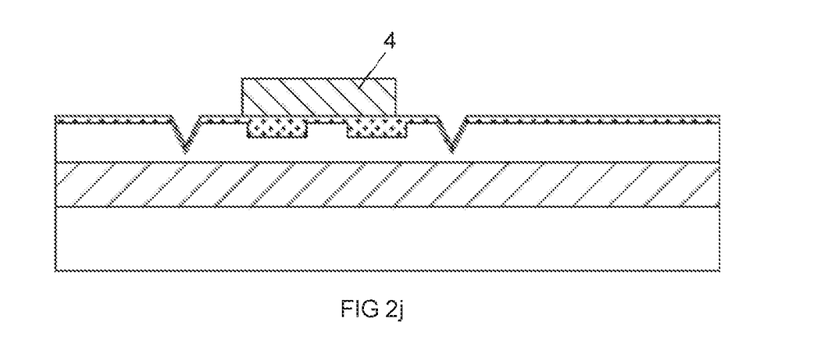
FIG. 2j illustrates a process for transfer-printing a III-V coupon, according to an example embodiment.

The operation of the stamp 8 can be as described in the article by De Groote et al., in that the speed of the stamp is greater when the stamp is retracted from the source substrate than from the target substrate. The high retraction speed from the source substrate results in the breaking of the tethers 7, while a lower retraction speed after transfer printing to the target substrate releases the stamp from the encapsulation layer 6. The encapsulation layer 6 and the portions 18 of the support layer are then stripped, leaving the original III-V coupon 4 coupled to the target substrate (FIG. 2j). The alignment accuracy generally depends on the accuracy of the lithography and etch processes used for forming the hollow alignment markers 15 and 25, which can determine the accuracy of the relative position of the hollow alignment markers 15 with respect to the coupon 4 and the relative position of the hollow alignment markers 25 with respect to the target location on the target substrate where the coupon is to be placed. The accuracy of these processes is generally high and thus can allow the accuracy of the alignment in the transfer processing to be improved over existing methods, regardless of the number of coupons that is transferred. The fact that the solid alignment markers 19 are applied to a layer 16/18 in which the original III-V coupon 4 is embedded results in an improved alignment without requiring dedicated processing of the III-V coupons 4 themselves.

When a large array of coupons is transfer printed, the initial alignment of the complete array prior to the actual placement of the coupons may be done by visual markers as explained above or by any other known alignment method. As the array of coupons is subsequently placed on the target substrate, any errors caused by pitch deviations in the array may be compensated through the 3-dimensional alignment markers. In other words, as the array of coupons approaches the target substrate, individual coupons may be shifted into place, relative to other coupons of the array, under the influence of the engaging alignment markers, thereby achieving the same alignment accuracy of the individual coupons across the complete array. The relative shift of one coupon to another is enabled by the flexibility of the stamp material. The method thus can provide a considerable improvement when applied to the transfer printing of large arrays of coupons. The method is however also applicable to small arrays as well as to individual coupons.

The method is also applicable to the transfer of a limited number of coupons from a large array by a patterned stamp which makes contact to the source and target substrate only in selected positions. This is the so-called area magnification referred to above. The same beneficial effect can be achieved here in terms of the obtainable alignment accuracy as in the case of the transfer of a complete array of coupons. Whether a stamp is used that picks up all the coupons at the same time, or a patterned stamp provided with posts for picking up selected coupons, the flexibility of the stamp material allows for a relative shift of the coupons to thereby enable the mutual engaging of the solid and hollow alignment markers 19 and 25.

The method of the disclosure is not limited to the above-described embodiments nor to the materials cited. Other materials may be chosen for the support layer 16 for example, such as silicon nitride or silicon oxide. The material of the support layer is selected to be able to fill the hollow alignment markers 15 when deposited and subsequently form a layer having sufficient hardness to form solid alignment markers 19 having suitable mechanical properties for the purpose of establishing the alignment by the lock-and-key engagement of the solid alignment markers 19 with the hollow alignment markers 25 in the target substrate. The material of the support layer 16 can be selected to have a good etching selectivity relative to the material of the target substrate (e.g., an upper layer of the target substrate) to enable selective removal of the support layer portions 18 from the target substrate after the transfer printing.

A further potential benefit of the method of the disclosure is that it can allow a greater flexibility of the production process of the semiconductor components which are to be coupled to the target substrate. In the production of III-V opto-electronic components, some production steps have in the past often been executed after the transfer of III-V coupons to the target substrate, precisely because of the lower alignment accuracy that could be achieved. Process steps for which the alignment requirements are most critical generally had to be done after the transfer. Processing on the target substrate is, however, in many cases technically challenging or costly. The present method can allow the performance of all or of an increased number of process steps on the source wafer. It is therefore a potential benefit of a method of the disclosure that devices can be tested on the source wafer, i.e. before their transfer to the target substrate. This can allow selection of working devices for the actual transfer.

Any details of the process described in the article by De Groote et al. cited above and not related to the support layer 16/18 or the 3-dimensional alignment markers 15, 19, and 25 can be applicable to the method of disclosure.

The disclosure is related also to a device assembly produced by a method of the disclosure, comprising at least one semiconductor component coupled to a target substrate, which may be a portion of the original target substrate obtained by sawing or other methods of sectioning the target substrate. Such a device assembly is characterized by the presence of the hollow alignment markers 25 in the target substrate portion in an area adjacent to and/or surrounding the at least one semiconductor component coupled to the target substrate portion. The hollow alignment markers are typically filled in the finished device assembly by additional layers deposited during the further processing or packaging of the device assembly. However, when these alignment markers 25 are observable in the device assembly, it is probable from the fact that the alignment markers are present adjacent to the at least one coupled semiconductor component that the method of the disclosure was applied in the production process of the device assembly.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for coupling a semiconductor component to a target substrate, the method comprising:
   providing on a surface of a source substrate a release layer;
   providing on the release layer a functional layer, the functional layer comprising one or more constituent layers of the semiconductor component;
   patterning the release layer and the functional layer to form on the surface of the source substrate an island formed from the release layer and a coupon formed from the functional layer on the island;
   forming a first hollow alignment marker at an exposed surface of the island in an area extending laterally outward from the coupon;
   forming a support layer covering the island and the coupon, thereby filling the first hollow alignment marker and embedding the island and the coupon within the support layer;
   patterning the support layer, thereby forming a package on the source substrate, the package comprising the island and the coupon embedded in a portion of the support layer;
   forming an encapsulating layer on the package and patterning the encapsulating layer, thereby forming a tether formed of the encapsulating layer that anchors the package to the source substrate;
   removing the island, thereby forming an enlarged coupon attached by the tether to the source substrate, the enlarged coupon comprising the portion of the support layer with the coupon embedded therein, the enlarged coupon comprising a solid alignment marker formed on an underside thereof, the solid alignment marker being formed from the support layer that previously filled the first hollow alignment marker in the release layer;
   removing the enlarged coupon from the source substrate using a stamp being formed from a flexible material;
   placing the enlarged coupon onto a target substrate to align the solid alignment marker of the enlarged coupon with a second hollow alignment marker of the target substrate, thereby attaching the enlarged coupon to a surface of the target substrate; and
   disengaging the stamp from the enlarged coupon and removing the encapsulation layer and the support layer, thereby leaving the coupon attached to the target substrate.

2. The method according to claim 1, wherein patterning the release layer and the functional layer comprises patterning the release layer and the functional layer to form an array of coupons from the functional layer on respective islands of the release layer, and wherein disengaging the stamp from the coupon and removing the encapsulation layer comprises leaving the array of coupons attached to respective hollow alignment markers of the target substrate.

3. The method according to claim 1, wherein the coupon is a first coupon, wherein patterning the release layer and the functional layer comprises patterning the release layer and the functional layer to form a second coupon from the functional layer on a second island of the release layer, and wherein disengaging the stamp from the first coupon and removing the encapsulation layer comprises leaving the second coupon attached to the stamp after attaching the first coupon to the target substrate.

4. The method according to claim 1, wherein the semiconductor component is a III-V optoelectronic component, and wherein the target substrate comprises an optical circuit to which the III-V optoelectronic component is configured to be coupled.

5. The method of claim 1, wherein the first hollow alignment marker has slanted side walls oriented downward from a surface of the island.

6. The method according to claim 1, wherein the second hollow alignment marker has slanted side walls oriented downward from a surface of the target substrate.

7. The method according to claim 1, wherein the first hollow alignment marker is V-shaped.

8. The method according to claim 1, wherein the second hollow alignment marker is V-shaped.

9. The method according to claim 1, wherein the support layer comprises amorphous silicon, silicon nitride, or silicon oxide.

10. A semiconductor device assembly comprising a target substrate and a semiconductor component coupled thereto, wherein the target substrate comprises a hollow alignment marker that is engaged with a solid alignment marker of the semiconductor component, wherein the hollow alignment marker is V-shaped.

11. A semiconductor device assembly comprising a target substrate and a semiconductor component coupled thereto, wherein the target substrate comprises a hollow alignment marker that is engaged with a solid alignment marker of the semiconductor component, wherein the solid alignment marker is V-shaped.

* * * * *